United States Patent [19]

Phelan

[11] Patent Number: 5,383,157
[45] Date of Patent: Jan. 17, 1995

[54] PARALLEL TESTMODE

[75] Inventor: Cathal G. Phelan, Santa Clara, Calif.

[73] Assignee: Cypress Semiconductor Corporation, San Jose, Calif.

[21] Appl. No.: 103,449

[22] Filed: Aug. 6, 1993

[51] Int. Cl.⁶ .............................................. G11C 7/00
[52] U.S. Cl. ................................ 365/201; 365/189.05; 371/21.1
[58] Field of Search .............. 365/201, 189.05, 189.01; 371/21.1, 21.2, 21.3

[56] References Cited

U.S. PATENT DOCUMENTS

| | | | |
|---|---|---|---|
| 4,860,259 | 8/1989 | Tobita | 365/201 |
| 4,873,669 | 10/1989 | Furutani et al. | 365/201 |

*Primary Examiner*—Eugene R. LaRoche
*Assistant Examiner*—Vu Le
*Attorney, Agent, or Firm*—Blakely, Sokoloff, Taylor & Zafman

[57] ABSTRACT

A testing circuit for reading and writing a greater number of data bits in parallel during a single clock cycle than through I/O data pins in a memory device. The testing circuit comprises at least one data-in buffer, a plurality of write buffers coupled to the data-in buffer, a plurality of write buses corresponding with the plurality of write buffers and coupled therewith, a plurality of read buses to retrieve data from a plurality of memory cells, a plurality of output buffers corresponding in number with the plurality of read buses and coupled therewith and at least one output driver. Additionally, the method of testing memory basically comprises the steps of inputting at least one data bit having the predetermined polarity into the memory device in order to produce a plurality of data bits having the predetermined polarity. These plurality of data bits are written in parallel into a plurality of memory cells. Thereafter, the plurality of data bits stored in the plurality of memory cells are retrieved and compared with the predetermined polarity to uncover any memory cell errors.

20 Claims, 5 Drawing Sheets

PARALLEL TESTMODE

BACKGROUND OF THE INVENTION

1. Field Of the Invention

The present invention relates to an apparatus and method for testing a plurality of memory cells contained in a memory device. More particularly, the present invention relates to testing circuit and method for reading and writing in parallel a greater number of data bits during a single clock cycle than is capable of being read from or written into the plurality of memory cells through its predetermined number of external input-/output data pins or pads (hereinafter referred to as "I/O data pins").

2. Description of Related Art

In today's semiconductor industry, memory devices such as static random access memory (SRAMs), random access memory (RAMs), direct random access memory (DRAMs) and the like are well known in the art. Such semiconductor memory devices are capable of being fabricated in a number of different configurations depending on its desired memory size and its desired number of I/O data pins. For example, a memory device containing approximately one million bits, or more specifically one million memory cells, could be fabricated as a 1M×1 memory device having only one I/O data pin. Similarly, the above-indicated memory device could be designed as a 256K×4 device having four I/O data pins, an 128K×8 device having eight I/O data pins, and so on. Accordingly, the presence of additional I/O data pins allows a greater number of bits to be read or written during the same clock cycle. In general, memory devices are commonly referred to by the number of I/O data pins therein. For instance, a n×8 memory device (where n is equal to a whole number) is commonly referred to as a "×8 device", indicating that it has eight I/O data pins to enable the device to read or write eight bits of data in parallel into eight memory cells for each clock cycle.

Before placing a semiconductor memory device into the marketplace, its manufacturer tests each memory cell contained therein to determine whether it is functioning properly (i.e., whether it is properly retaining stored data). It is commonly known that conventional memory testing techniques are governed by the number of I/O data pins in the memory device. As shown in FIG. 1, a ×1 memory device 1 has only one I/O data pin 2 so that only one memory cell can be tested during each read or write cycle.

Semiconductor memory testing is usually accomplished by inputting bits of data into at least one internal write buffer 4 from a buffering device, called a data-in buffer 3, which regulates the inputted data bits. The data bits comprise one of two opposite polarities (either a "1" or "0"). The write buffer 4, in turn, drives at least one write bus 5 to write a first selected polarity into every memory cell 6 contained in the device. Thereafter, a first memory cell is read to confirm that a polarity stored in the memory cell is equivalent to the first selected polarity. This is done in a manner similar to the write operation to read the stored polarity from a memory cell 6, where at least one read bus 7 is activated causing at least one output buffer 8 to drive the stored polarity into the I/O data pin 2 or any other designated I/O data pin.

If these polarities are the same, then a second of the two polarities is inputted into the first memory cell and read therefrom. If such polarities are also equivalent, then the first memory cell is determined to be functioning properly. This testing procedure is continued until every cell in the semiconductor memory device has been tested. Although different manufacturers may vary this testing technique slightly, they cannot avoid conducting multiple write and read operations.

A primary problem associated with conventional testing techniques is that it is extremely time consuming and thereby costly to perform. For instance, a n×m memory device requires "n" write cycles to write "m" bits of data into the memory cells. As the semiconductor industry continues to create memory devices with greater memory capacity, testing costs will increase proportionately and become one of its highest manufacturing costs.

In order to alleviate rising testing costs, many semiconductor memory manufacturers have concentrated on improving read time access in an effort to lessen testing time. Additionally, at least Assignee corporation has begun to design and fabricate semiconductor memory devices having a standard internal design with a larger bit width than its number of I/O data pins. More specifically, a semiconductor memory device could be internally designed as a ×8 device, but utilizes certain metal options to configure the device to operate as a ×1 or ×4 device. Although the memory device can be designed internally to be any size, it is generally designed internally to be a ×8 device because it is the most common standard used by the computer industry.

Based on the foregoing, it would be desirable to have a capability of testing every memory cell in a memory device by reading and writing a large number of data bits in parallel in order to lessen testing time. Therefore, it is an object of the present invention to provide an apparatus and method for reading and writing in parallel a greater number of data bits during a single clock cycle than capable of being inputted into the memory device through its predetermined number of I/O data pins.

Another object of the present invention is to provide an apparatus and method for decreasing the monetary costs associated with conventional testing techniques.

A further object of the present invention is to provide an apparatus and method for decreasing the testing time associated with conventional testing techniques.

BRIEF SUMMARY OF THE INVENTION

The present invention relates to an apparatus and method for testing a memory cell. More particularly, the present invention relates to a testing circuit for reading and writing parallel a greater number of data bits during a single clock cycle than through I/O data pins in a memory device. The testing circuit comprising at least one data-in buffer, a plurality of write buffers coupled to the at least one data-in buffer, a plurality of write buses corresponding with the plurality of write buffers and coupled therewith, a plurality of read buses to retrieve data from a plurality of memory cells, a plurality of output buffers corresponding in number with the plurality of read buses and coupled therewith, and at least one output driver.

The method of testing memory in parallel comprising the following nine steps. First, at least one data bit having the predetermined polarity is inputted from the at least one I/O data source into the memory device. Next, the at least one data bit having the predetermined polarity is transferred into a plurality of write buffers in order to produce a plurality of data bits having the predetermined polarity. Thereafter, a selection of each of the plurality of write buffers is made so as to drive the plurality of data bits having the predetermined polarity into a corresponding plurality of write buses. Then, the plurality of data bits having the predetermined polarity is written in parallel into the plurality of memory cells. Next, a plurality of data bits stored in the plurality of memory cells are retrieved therefrom and placed into a corresponding plurality of read buses. Thereafter, the stored plurality of data bits are driven into a plurality of output buffers. In addition, each of the plurality of output buffers are selected to drive the stored plurality of data bits. The next steps is that a number of read output signal lines corresponding to the plurality of output buffers are preset to drive the predetermined polarity. Finally, a signal having a polarity differing from the predetermined polarity is generated upon detection of a polarity not equal to the predetermined polarity.

BRIEF DESCRIPTION OF THE DRAWINGS

The objects, features and advantages of the present invention will become apparent from the following detailed description of the present invention in which.

DETAILED DESCRIPTION OF THE INVENTION

An apparatus and method is described for testing memory cells of a memory device, and more particularly, relates to a testing circuit and procedure designed to read and write in parallel more bits of data than a predetermined number of I/O data pins in the memory device. In the following detailed description, many specific details are set forth, such as specific internal design configurations of the memory device, in order to provide a thorough understanding of the present invention. It is apparent, however, to one of ordinary skill in the art, that the present invention may be practiced without incorporating such specific design configurations. In other instances, well-known structures, operations, process steps and the like, have not been described in detail in order not to unnecessarily obscure the present invention.

Furthermore, a specific example has been created for the sole purpose of illustrating the differences in operation between a conventional testing techniques and the present invention. This specific example lends itself to explaining the operational differences, but is in no way a limitation on the scope of the present invention.

Figure 1:
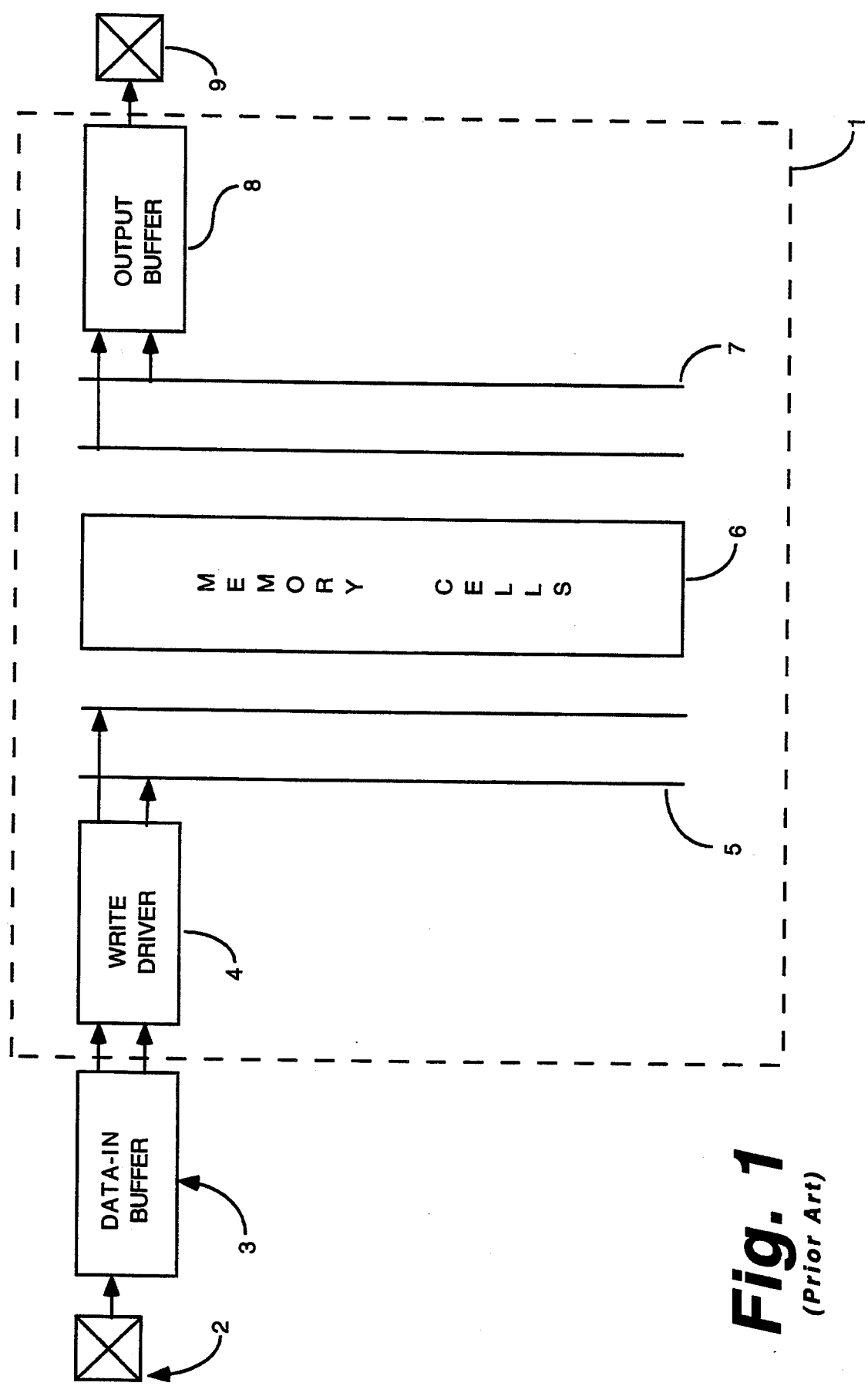
FIG. 1 is a circuit diagram of a conventional ×1 memory device having an internal ×1 memory design.
Figure 2:
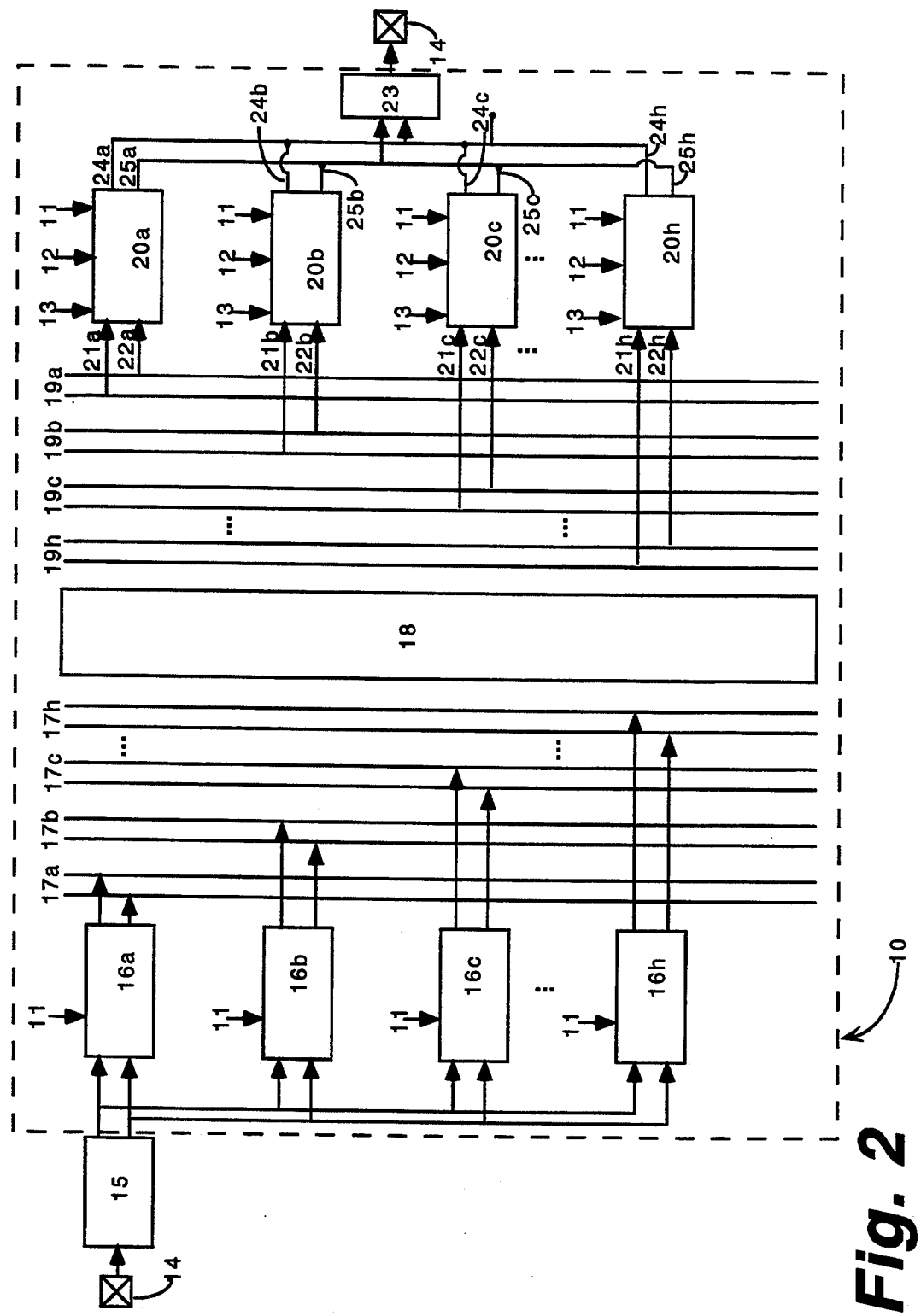
FIG. 2 is a circuit diagram of the present invention for a ×1 memory device having a ×8 internal memory design.

One embodiment of the present invention is illustrated in FIG. 2 is a ×1 memory device 10 having an ×8 internal design. Accordingly, the memory device 10 normally operates as a ×1 device, but is capable of operating as a ×8 device in accordance with the activation of certain control data signals; namely, TESTMODE 11, EXPECTED DATA 0 ("ED0") 12 and EXPECTED DATA 1 ("ED1") 13, all of which will be described below in more detail. It should be borne in mind that the present invention need not be limited to such specific design, but may find wide application for many other internal designs. Also, while the present description discusses using complementary (i.e., dual) signal lines within the memory device 10, it is also contemplated that the present invention can be used with other signal line configurations.

The embodiment of the semiconductor memory device shown in FIG. 2 comprises a write portion and a read portion. Since such embodiment has one I/O data pin 14 and eight internal I/O data paths, the write portion includes one data-in buffer 15 coupled to eight write buffers 16a-16h, wherein each of the eight write buffers 16a-16h is coupled to a corresponding write bus 17a-17h in order to write data bits into the memory cells 19.

The data-in buffer 15 is a conventional component, typically in the form of a NAND gate with its output coupled to at least one inverter to provide a buffering effect. However, the data-in buffer 15 could be designed as any conventional device as long as it provides proper buffering functions. The data-in buffer 15 is coupled to the external I/O data pin 14 to receive data therefrom and is designed to drive data into each of the eight write buffers 16a-16h via complementary input write signal lines 26a-26h and 27a-27h. The write buffers 16a-16h are generally NAND and inverter combinations, but may be combinations of conventional logic elements which act to buffer data inputted therein.

Each write buffer 16a-16h is selectable by a conventional address decoder (not shown) operating in accordance to a predetermined address code scheme as well as other conventional control signals. The address decoder is coupled to at least the TESTMODE control signal 11 so that when TESTMODE is activated, the address decoder selects all eight write buffers 16a-16h. As a result, each write buffer 16a-16h simultaneously drives the same data from the data-in buffer 15 into its corresponding write bus 17a-17h via complementary output write signal lines 28a-28h and 29a-29h. Thus, in the embodiment illustrated in FIG. 2, eight bits of identical data inputted into the data-in buffer 15 are written in parallel into the memory cells 18. This is preferable when conducting memory reliability testing because the data is usually a single polarity which is inputted into every memory cell.

With respect to the read portion in FIG. 2, it includes a plurality of read buses 19a-19h, each of which coupled to a corresponding output buffer 20a-20h through complementary input data lines, namely $\overline{\text{READ\_DATA-IN}}$ 21a-21h and READ_DATA-IN 22a-22h. In addition, each corresponding output buffer 20a-20h is further coupled to an output driver 23, which is optionally positioned within the memory device 10, through complementary read output data lines $\overline{\text{READ\_DATA-OUT}}$ 24a-24h and READ_DATA-OUT 25a-25h, shown in more detail in FIG. 3. In the present invention, these complementary read data lines are used to maintain separation of data for speed and switching considerations. The $\overline{\text{READ\_DATA-OUT}}$ data lines 24a-24h are "wired or'ed" together and the READ_DATA-OUT data lines 25a-25h are also "wired or'ed".

Upon receipt of a read instruction, the plurality of read buses 19a-19h are activated causing the corresponding output buffers 20a-20h to read data stored in the memory cells 18. Although it is not necessary to the present invention, either decoding logic, sense amplifiers, which are circuits that amplify the magnitude of a data signal to be closer to ground or Vcc, or a combination of the two, may be implemented between each of the plurality of buses 19a-19h and its corresponding output buffer 20a-20h.

Besides the above-indicated inputs and outputs, each of the plurality of output buffers 20a-20h has a plurality of input control signals to control operations thereof. Such control signals include the TESTMODE control signal 11 from the address decoder and at least one "Expected Data" signal. In the preferred embodiment, there exists two "Expected Data" signals, namely ED0 12 and ED1 13; however, such signals could be obtained from a single I/O data pin to form both complementary signals through logical devices such as inverters.

Similar to the operations of the plurality of write buffers, the address decoder selects which output buffer 20a-20h drives the output driver 23 by activating the TESTMODE control signal 11. Such TESTMODE signal 11 performs two functions. First, when it is activated, all eight of the output buffers 20a-20h are simultaneously activated so that each of the output buffers 20a-20h will attempt to drive its respective data bit to the output driver 23. Secondly, it performs certain disabling functions which influence the operations of the output buffers 20a-20h as discussed with respect to FIG. 3.

While implementation of the TESTMODE control signal 11 provides parallel read and write functionality, it does not assist the output driver 23 in detecting whether certain memory cells 18 in the device are defective. In fact, since the READ_DATA-OUT data lines 24a-24h and the READ_DATA-OUT data lines 25a-25h are respectively "wired or'ed" together, no defects in the memory cells 18 are detected unless a majority of the output buffers 20a-20h are found to drive non-expected data (i.e., data having a polarity contrary to that previously written into the memory cell). Such inability to detect a single defective memory cell, or even a minority of detective cells, is due to the fact that the majority of output buffers 20a-20h driving "expected" data (i.e., data having the same polarity as that previously written into the memory cell) will overcome a limited number of output buffers driving "non-expected" data.

In order to prevent any possibility of this from occurring, the present invention further implements two control signals ED0 12 and ED1 13 as inputs into each of the output buffers 20a-20h in such a manner as to detect non-expected data and to preset the output buffers 20a-20h to drive expected data into the output driver 23.

Figure 3:
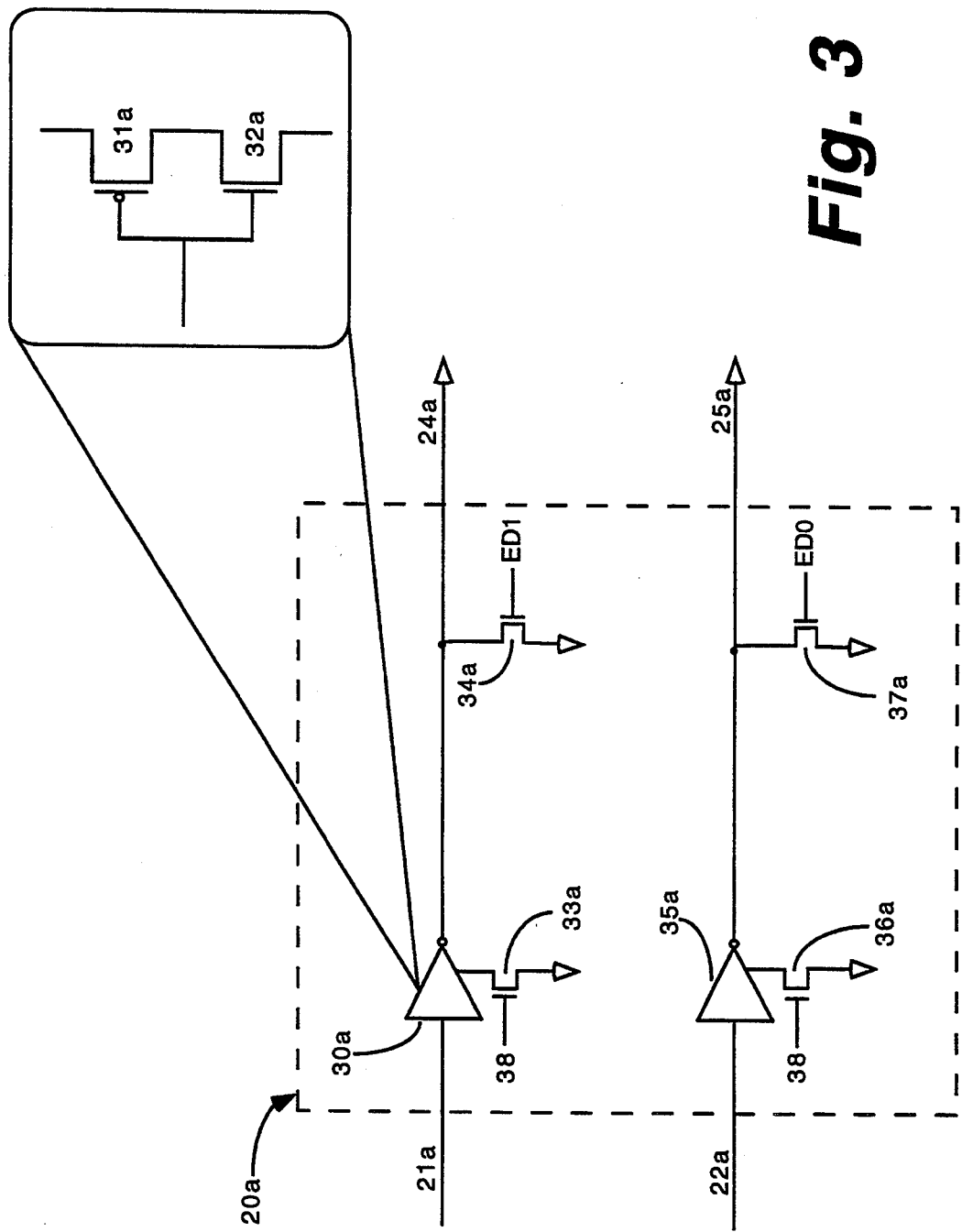
FIG. 3 is a preferred embodiment of a output buffer as shown in FIG. 2.

Referring now to FIG. 3, this illustration shows only a first output buffer 20a since each of the plurality of output buffers 20a-20h are identical. The output buffer 20a comprises at least a first inverter 30a, preferably a CMOS inverter, in series with the READ_DATA-OUT read output data line 24a and at least a second inverter in series with the READ_DATA-OUT read output data line 25a. With respect to the READ_DATA-OUT data line 24a, the first inverter 30a has an additional NMOS transistor 33a in series with a NMOS transistor 32a of the first inverter 30a. The gate of the NMOS transistor 33a is tied to a TESTMODE control signal to enable the NMOS transistor 33a when the TESTMODE control signal 11 is not active so as to allow the first inverter 30a to function properly. Additionally, another NMOS transistor 34a is coupled in series with the first inverter 30a, wherein the gate of the NMOS transistor 34a is tied to the ED1 signal line 13. The NMOS transistor 34a pulls the READ_DATA-OUT data line 24a low when the expected data is a logic "1".

The READ_DATA-OUT read output data line 25a is designed exactly the same as the READ_DATA-OUT data line 24a with one exception, a gate of a NMOS transistor 37a coupled in series with the second inverter 35a is tied to the ED0 signal line 12. In other words, the second inverter 35a has an NMOS transistor 36a in series with a NMOS transistor of the second inverter 35a (not shown) with the gate of the transistor 36a tied to TESTMODE control signal 38.

When the TESTMODE control line 11 is activated, the NMOS transistors 33a and 36a are disabled so that the first and second inverters 30a and 35a do not invert the inputted signals on the READ_DATA-OUT and READ_DATA-OUT data lines 24a and 25a respectively. Rather, the first and second inverters 30a and 35a are capable of driving only a "1". When the TESTMODE control signal 11 is active and the expected data is a "0", the ED0 signal line 12 is activated causing the NMOS transistor 37a to preset the READ_DATA-OUT data line 25a by pulling it down to ground. Moreover, in the event that the expected data is a "1", the ED1 signal line 13 is activated thereby enabling the NMOS transistor 34a so it can pull-down the READ_DATA-OUT data line 24a. The preset signals, however, are altered in the output driver 23 to generate either a "1" or "0" output. Therefore, the present invention is designed to detect non-expected (or corrupted) data and drives the expected data state, unless non-expected data is detected by the output buffers 20a-20h. If so, it outputs a tri-state level, which is usually a voltage level of approximately 1.7 volts but could be any constant voltage, when it does not detect non-expected data.

In order to explain the operation in more detail, we shall discuss a specific example. As previously mentioned herein, for the purpose of distinguishing the operation of the conventional testing apparatus and methods from those of the present invention, the specific example has been formulated. As previously mentioned herein, this specific example lends itself to explaining the operation of the present invention and in no way should be construed as a limitation on the scope of the invention.

In a hypothetical testing procedure, let us presume that a "0" is written into every memory cell in the semiconductor memory device, the TESTMODE signal 11 is activated to allow parallel writes and reads during a memory testing stage. Upon reading the data bits from the memory cells, one would expect to read a "0". Therefore, it is desirable to only detect whether a "1" was erroneously stored in the memory. This is accomplished by presetting the output buffers to output a "0" but generating a tri-state signal if any of the plurality of output buffers detects non-expected data.

Since the TESTMODE data signal is active, the NMOS transistors 33a-33h and 36a-36h in series respectively with each of the NMOS transistors of the CMOS first inverters and second inverters 30a-30h and 35a-35h are disabled so that the output buffers 20a-20h do not operate as CMOS inverters. Instead, the ED0 signal line 12 is activated so as to preset each of the output buffers 20a-20h to output the "0" onto the READ_DATA-OUT read output data lines 25a-25h. As a result, the output driver 23 continues to be driven by the preset output signal until a "1" is detected by any of the output bluffers 20a-20h, indicating that a memory cell in the memory device 10 did not function properly. Once a "1" is detected, it is sufficient to overcome the preset and thereby, the output buffers which detected the "1" generates a tri-state signal.

Furthermore, although not shown, another embodiment of the present invention may include a high ohmic resistor or a transistor coupled between Vcc and either READ_DATA-OUT and READ_DATA-OUT data lines 24a-24h and 25a-25h. With respect to the READ_DATA-OUT data lines 24a-24h, the transistor would include a source coupled to Vcc, a drain coupled to the READ_DATA-OUT data lines 24a-24h and a gate coupled to the $\overline{ED0}$ control signal 11. On the other hand, in the READ_DATA-OUT data lines 25a-25h, a transistor would include a source coupled to Vcc, a drain coupled to the READ_DATA-OUT data lines 24a-24h and a gate coupled to the $\overline{ED1}$ control signal 11. Such a design would allow the present invention to output a tri-state signal if all of the output buffers detected non-expected data.

Although the present disclosure discusses complementary (i.e., dual) read and write data lines, it is contemplated that the present invention could be implemented with only a single data line.

The following is a detailed description of the writing operations of the testing technique of the present invention pursuant to a particular design of the embodiment in FIG. 2. However, such procedures in FIGS. 4 and 5 can be used to test any design configuration of any memory device. As shown in the flow chart in FIG. 4, the writing procedure is accomplished through 6 steps. In Step 100, the memory cells are initialized to remove any extraneous information. In Step 101, data is inputted into the data-in buffer coupled an I/O data pin. The data commonly is a single polarity either a "1" or a "0". In Step 102, the data is transferred into each of the eight write buffers. Each of the write buffers are selectable by an address decoder to transfer the data to a corresponding write bus. If the TESTMODE control signal is activated by the address decoder (Step 103), then the address decoder selects all of the write buffers (Step 105). However, if the TESTMODE is not activated, then the memory device simply acts as a ×1 device and writes only one data bit at a time into different memory cells until each of the memory cells has certain data bits stores therein (Step 104). If the TESTMODE is activated, each of the write buffers drives the data into its corresponding write buses to write such data into eight memory cells (Step 106).

Figure 4:
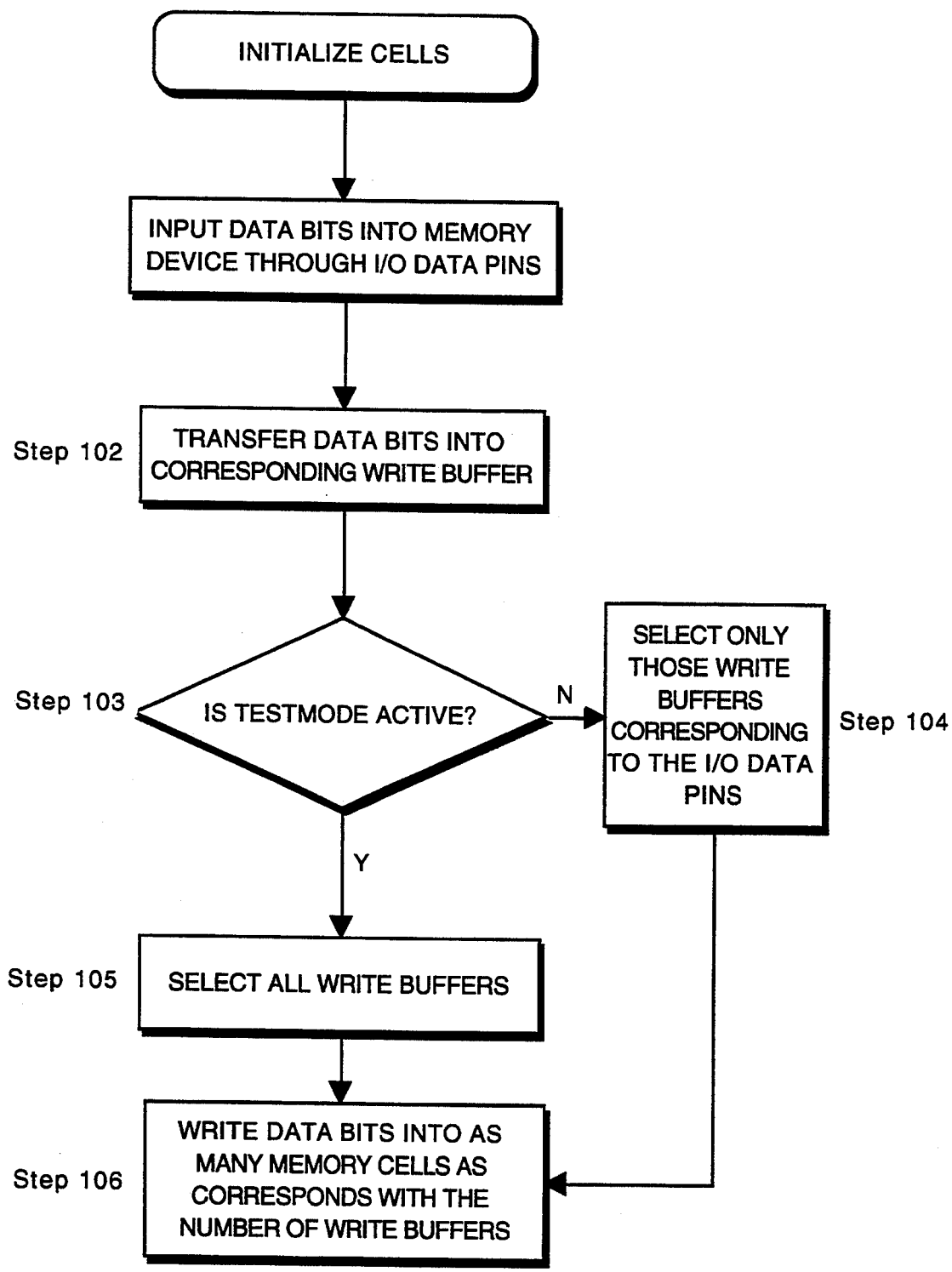
FIG. 4 is a method for writing data from the memory cells in order to test whether such cells are functioning properly in accordance with the present invention as shown in FIG. 2.
Figure 5:
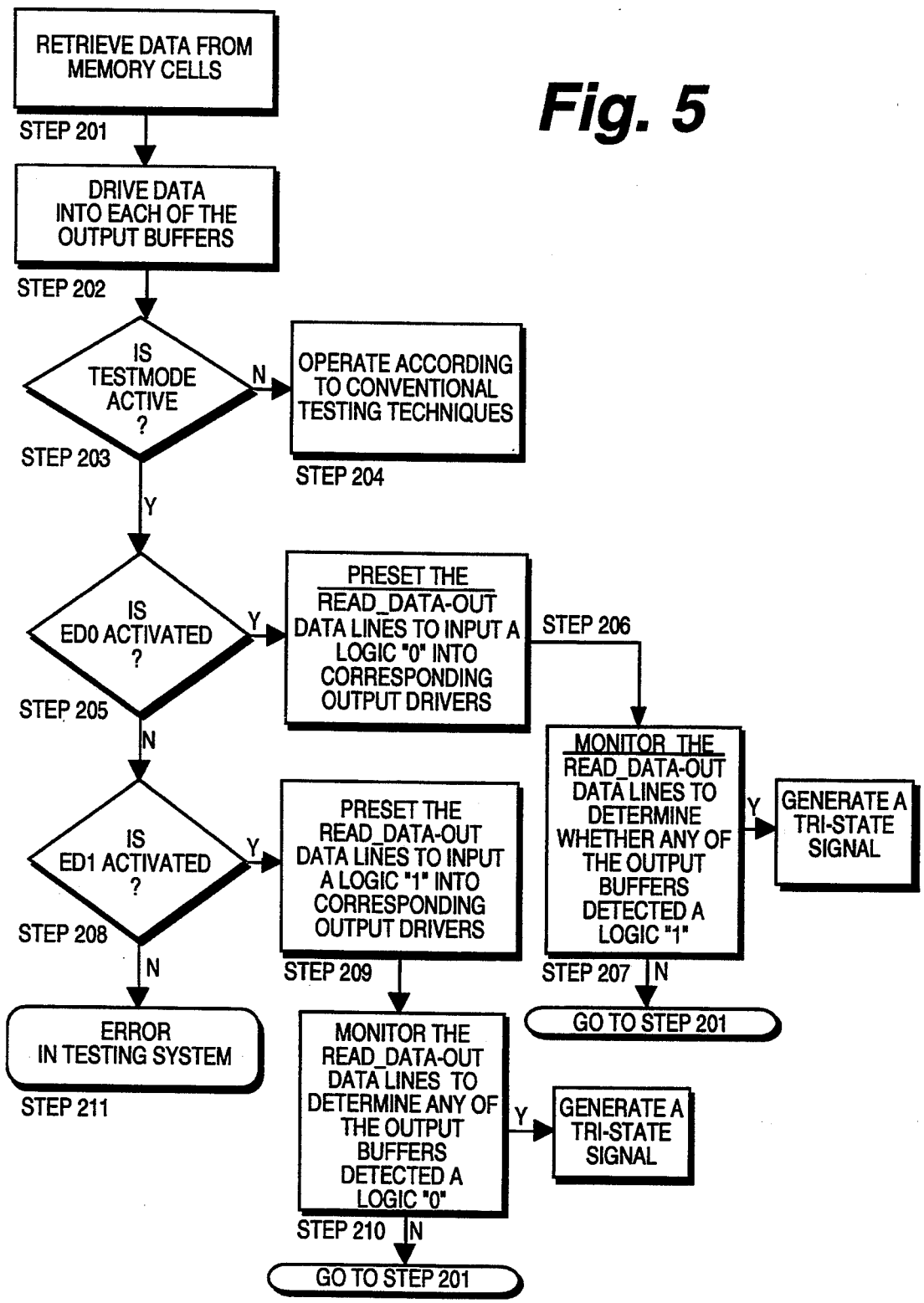
FIG. 5 is a method for reading data from the memory cells in order to test whether such cells are functioning properly in accordance with the present invention as shown in FIG. 2.

Referring now to FIG. 5, the reading operations immediately follow the writing procedure to FIG. 4. First, in Step 201, the data is retrieved from the memory cells through read buses. Then, each corresponding read bus drives such data into a corresponding output buffers (Step 202). In Step 203, the system determines whether TESTMODE in active. If not, then only that output buffer selected by the address decoder will output the data bit into the output driver (Step 204). If, on the other hand, TESTMODE is activated, the address decoder selects every output buffer to drive non-expected data. In Step 205, if TESTMODE is activated, then a second determination is made to determine what data constitutes "non-expected" data. Initially, a determination must be made whether ED0 is activated. If so, then the READ_DATA-OUT data lines 25a-25h are preset to output a logic "0" from the output buffers 20a-20h into the output driver 23 (Step 206). As a result, the output driver 23 drives a logic "0", unless any of the output buffers 20a-20h have detected non-expected data bits; namely, a logic "1" in this example. In this case, one would monitor the READ_DATA-OUT data lines 25a-25h for a standard tri-state signal (Step 207). Otherwise, a determination is made as to whether ED1 is activated (Step 208) and if so, then the READ_DATA-OUT data lines 24a-24h are preset to drive a logic "1" into the output driver 23 (Step 209). Similar to Step 207, one would monitor the READ_DATA-OUT data lines 24a-24h for the tri-state signal. If neither ED0 or ED1 is enabled, then there exists an error in the testing (Step 211).

The present invention described herein may be designed in many different methods and using many different configurations. While the present invention has been described in terms of various embodiments, other embodiments may come to mind to those skilled in the art without departing from the spirit and scope of the present invention. The invention should, therefore, be measured in terms of the claims which follow.

What we claim is:

1. A memory device having at least one I/O data source, said memory device including an electrical circuit for writing in parallel a plurality of data bits each having a predetermined polarity into a plurality of memory cells and for reading a corresponding plurality of data bits stored in said plurality of memory cells, both said plurality of data bits having the predetermined polarity and said stored plurality of data bits being greater in number than said at least one I/O data source, said circuit comprising:

means for buffering at least one data bit having the predetermined polarity, said buffering means coupled to said at least one I/O data source;

means for replicating said at least one data bit having the predetermined polarity into said plurality of data bits having the predetermined polarity and for driving in parallel said plurality of data bits having the predetermined polarity;

bus means for writing in parallel said plurality of data bits having the predetermined polarity into said plurality of memory cells, said write bus means being coupled to said replicating and driving means;

bus means for reading said stored plurality of data bits from said plurality of memory cells;

means for detecting whether each of said stored plurality of data bits contain the predetermined polarity, said detecting means further includes:

means for presetting said detecting means to drive the predetermined polarity, means for disabling said detecting means so as to perform as a driver, and means for generating a constant voltage output signal if any of said stored plurality of data bits are not equivalent to the predetermined polarity; and means for selecting said replicating and drive means and said detecting means.

2. The memory device according to claim 1, wherein said buffering means include at least one data-in buffer, each of said at least one data-in buffer outputs said at least one data bit having the predetermined polarity into said replicating and driving means.

3. The memory device according to claim 2, wherein said replicating and driving means includes a plurality of write buffers each coupled to said at least one data-in buffer so as to receive said at least one data bit therefrom and drive said plurality of data bits having the predetermined polarity into said write bus means.

4. The memory device according to claim 3, wherein said write bus means includes a plurality of write buses corresponding to said plurality of write buffers and coupled therewith in order to write said plurality of data bits having the predetermined polarity into said plurality of memory cells.

5. The memory device according to claim 4, wherein said read bus means includes a plurality of read buses, each of which is coupled to said detecting means through a pair of complementary read input signal lines in order to read said stored plurality of data bits from said plurality of memory cells.

6. The memory device according to claim 1, wherein said detecting means includes a plurality of output buffers, each of said plurality of output buffers receiving said stored plurality of data bits through said read bus means via a plurality of complementary read input signal lines and outputting said stored plurality of data bits through a plurality of complementary read output signal lines, wherein each of said plurality of output buffers include at least a first CMOS inverter having a first PMOS transistor and a first NMOS transistor being coupled between a first of said complementary read input signal lines and a first of said complementary read output signal lines and at least a second CMOS inverter having a second PMOS transistor and a second NMOS transistor being coupled between a second of said complementary read input signal lines and a second of said complementary read output signal lines.

7. The memory device according to claim 6, wherein said disabling means includes a third NMOS transistor being coupled in series with said first NMOS transistor of said first CMOS inverter and a fourth NMOS transistor being coupled in series with said second NMOS transistor of said second CMOS inverter, both said third and fourth NMOS transistors having their gates complementarily coupled to said selecting means.

8. The memory device according to claim 7, wherein said preset means includes a fifth NMOS transistor coupled to said first of said complementary read output signal lines and a sixth NMOS transistor coupled to a second of said complementary read output signal lines, wherein a gate of the fifth NMOS transistor is coupled to a first control signal and a gate of the sixth NMOS transistor is coupled to a second control signal.

9. The memory device according to claim 8, wherein said first control signal is active if the predetermined polarity is equal to a logic 1 and said second control signal is active if the predetermined polarity is equal to a logic 0.

10. The memory device according to claim 8, wherein said selecting means includes an address decoder coupled said plurality of write buffers and output buffers.

11. The memory device according to claim 1, wherein said circuit further comprises means for receiving as input a signal through said complementary read output signal lines and outputting a signal from said circuit.

12. A memory device having at least one I/O data source, said memory device including an electrical circuit for writing in parallel a plurality of data bits each having a predetermined polarity in a plurality of memory cells and for reading a corresponding plurality of data bits stored in said plurality of memory cells, both said plurality of data bits having the predetermined polarity and said stored plurality of data bits being greater in number than said at least one I/O data source, said circuit comprising:

at least one data-in buffer each of said at least one data-in buffer outputs said at least one data bit having the predetermined polarity, said at least one data-in buffer is coupled to said at least one I/O) data source;

a plurality of write buffers each coupled to said at least one data-in buffer so as to receive said at least one data bit therefrom and drive said plurality of data bits having the predetermined polarity into bus means for writing in parallel said plurality of data bits having the predetermined polarity into said plurality of memory cells;

bus means for reading said stored plurality of data bits from said plurality of memory cells;

a plurality of output buffers, each of said plurality of output buffers receiving said stored plurality of data bits through said read bus means and outputting said stored plurality of data bits, each of said plurality of output buffers include at least a first CMOS inverter having a first PMOS transistor and a first NMOS transistor being coupled between a first of said complementary a first of a plurality of and a first of a plurality of complementary read output signal lines and at least a second CMOS inverter having a second PMOS transistor and a second NMOS transistor being coupled between a second of said complementary read input signal lines and a second of said complementary read output signal lines;

means for detecting whether each of said stored plurality of data bits contain the predetermined polarity, said detecting means further includes:

means for presetting said plurality of output buffers to drive the predetermined polarity, means for disabling said plurality of output buffers so as to have non-inversion characteristics, and means for generating a constant voltage output signal if any of said stored plurality of data bits are not equivalent to the predetermined polarity;

an address decoder coupled said plurality of write buffers and said plurality of output buffers; and means for outputting a signal from said circuit.

13. A method for testing a plurality of memory cells contained in a memory device by writing in parallel a plurality of data bits each having a predetermined polarity into said plurality of memory cells and for reading a corresponding plurality of data bits from said plurality of memory cells, both said plurality of data bits having the predetermined polarity and said corresponding plurality of data bits being greater in number than said at least one I/O data source, said testing method comprising the steps of:

inputting at least one data bit having the predetermined polarity from said at least one I/O data source into said memory device;

transfering said at least one data bit having the predetermined polarity into a plurality of write buffers in order to produce a plurality of data bits having the predetermined polarity;

selecting each of the plurality of write buffers to drive the plurality of data bits having the predetermined polarity into a corresponding plurality of write buses;

writing in parallel the plurality of data bits having the predetermined polarity into the plurality of memory cells;

retrieving a plurality of data bits stored in said plurality of memory cells into a corresponding plurality of read buses;

driving the stored plurality of data bits into a plurality of output butters;

selecting each of the plurality of output buffers to drive said stored plurality of data bits;

presetting a number of read output signal lines corresponding to said plurality of output buffers to drive the predetermined polarity; and generating a signal having a polarity differing from said predetermined polarity upon detection of a polarity not equal to the predetermined polarity.

14. The method according to claim 13, wherein said step of selecting the plurality of write buffers includes a step in determining whether a first control signal is active.

15. The method according to claim 14, wherein said step of selecting the plurality of output buffers includes a step in determining whether the first control signals active.

16. The method according to claim 13, wherein said step of presetting the corresponding read output signal lines includes a step in determining whether a second control signal is active.

17. The method according to claim 16, wherein said step of presetting the corresponding read output signal lines further includes a step in determining whether a third control signal is active.

18. The method according to claim 16, wherein said step of generating said signal having a polarity differing from said predetermined polarity includes a step of monitoring whether a plurality of first read output signal lines are driving a low level signal.

19. The method according to claim 17, wherein said step of generating said signal having a polarity differing from said predetermined polarity includes a step of monitoring whether a plurality of second read output signal lines are driving a high level signal.

20. A memory device having at least one I/O data source, said memory device including an electrical circuit for writing in parallel a plurality of data bits each having a predetermined polarity into a plurality of memory cells and for reading a corresponding plurality of data bits stored in said plurality of memory cells, both said plurality of data bits having the predetermined polarity and said stored plurality of data bits being greater in number than said at least one I/O data source, said circuit comprising:

means for replicating said at least one data bit having the predetermined polarity into said plurality of data bits having the predetermined polarity and for driving in parallel said plurality of data bits having the predetermined polarity;

bus means for writing in parallel said plurality of data bits having the predetermined polarity into said plurality of memory cells, said write bus means being coupled to said replicating and driving means;

bus means for reading said stored plurality of data bits from said plurality of memory cells;

means for detecting whether each of said stored plurality of data bits contain the predetermined polarity, said detecting means includes:

means for presetting said detecting means to drive the predetermined polarity, and means for disabling said detecting means so as to perform as a driver; and means for selecting said replicating and drive means and said detecting means.

* * * * *